(12) United States Patent
Kimura

(10) Patent No.: US 7,782,444 B2
(45) Date of Patent: Aug. 24, 2010

(54) TOP PLATE, POSITIONING APPARATUS, EXPOSURE APPARATUS, AND DEVICE MANUFACTURING METHOD

(75) Inventor: Atsushi Kimura, Funabashi (JP)

(73) Assignee: Canon Kabushiki Kaisha, Tokyo (JP)

( * ) Notice: Subject to any disclaimer, the term of this patent is extended or adjusted under 35 U.S.C. 154(b) by 877 days.

(21) Appl. No.: 11/627,517

(22) Filed: Jan. 26, 2007

(65) Prior Publication Data
US 2007/0173098 A1 Jul. 26, 2007

(30) Foreign Application Priority Data
Jan. 26, 2006 (JP) ............................. 2006-018014

(51) Int. Cl.
G03B 27/58 (2006.01)
G03B 27/42 (2006.01)
G03B 27/62 (2006.01)
H02K 41/02 (2006.01)

(52) U.S. Cl. ............................. 355/72; 355/53; 355/75; 310/12.06

(58) Field of Classification Search .................. 355/53, 355/72, 75; 310/12, 12.06
See application file for complete search history.

(56) References Cited

U.S. PATENT DOCUMENTS 6,188,150 B1 * 2/2001 Spence .................... 310/12.17
6,987,335 B2 1/2006 Korenaga
6,992,755 B2 1/2006 Kubo
7,061,588 B2 6/2006 Kubo
7,064,808 B1 6/2006 Gilissen et al.
7,075,198 B2 7/2006 Korenaga
7,075,624 B2 7/2006 Kubo
2002/0159046 A1* 10/2002 Binnard et al. ................. 355/74
2005/0151945 A1* 7/2005 Van Der Schoot et al. .... 355/53
2005/0269525 A1* 12/2005 Terken et al. ............ 250/492.2
2006/0000378 A1* 1/2006 Kubo ......................... 101/477
2006/0214519 A1 9/2006 Korenaga
2006/0215145 A1 9/2006 Kubo

FOREIGN PATENT DOCUMENTS

| JP | 2003-163257 A | 6/2003 |
|---|---|---|
| JP | 2004-254489 A | 9/2004 |
| KR | 2004-93408 A | 11/2004 |
| TW | 446597 B | 7/2001 |
| TW | 200307181 A | 12/2003 |

OTHER PUBLICATIONS

English Translation of KR 2004-93408 (dated Nov. 2004).*

* cited by examiner

*Primary Examiner*—Alan A Mathews
(74) *Attorney, Agent, or Firm*—Canon USA Inc IP Division

(57) ABSTRACT

A top plate is configured to surround a space with a first plate member and a second plate member which oppose each other and a side wall member. The top plate includes a rib arranged in the space. The rib includes a plurality of connecting portions. Each connecting portion respectively connects to either the side wall member or a member in the space. The rib has a thickness at a portion between adjacent connecting portions which is larger than the thickness at each connecting portion.

6 Claims, 18 Drawing Sheets

PORTION C

TOP PLATE, POSITIONING APPARATUS, EXPOSURE APPARATUS, AND DEVICE MANUFACTURING METHOD

BACKGROUND OF THE INVENTION

1. Field of the Invention

The present invention relates to a top plate, positioning apparatus, exposure apparatus, and device manufacturing method and, more particularly, to a top plate having a hollow structure, a positioning apparatus including the top plate, an exposure apparatus including the positioning apparatus, and a device manufacturing method utilizing the exposure apparatus.

2. Description of the Related Art

FIG. 10 is a schematic perspective view of a positioning apparatus formed as a wafer stage apparatus. A slider surface plate 75 is mounted at the center of a base surface plate 79, and X surface plates 78X and Y surface plates 78Y are mounted around the slider surface plate 75. Stators 77X of coarse linear motors which drive an X beam 73X in the X direction are mounted on the X surface plates 78X, respectively. Stators 77Y of coarse linear motors which drive a Y beam 73Y in the Y direction are mounted on the Y surface plates 78Y, respectively.

The X beam 73X and Y beam 73Y are arranged to intersect each other and extend through an X-Y slider 72. The X beam 73X and Y beam 73Y drive the X-Y slider 72 in the X and Y directions while maintaining a non-contact state with the X-Y slider 72. A six-axis fine stage 70 is mounted on the X-Y slider 72. A wafer chuck is mounted on the six-axis fine stage 70.

The Y beam 73Y has Y feet 74Y, to which static pressure air bearings (not shown) attach, at its two ends. The slider surface plate 75 supports the Y beam 73Y in the vertical direction (Z-axis direction) through the static pressure air bearings. The X beam 73X has an X foot 74X and X foot 74X' at its two ends. The slider surface plate 75 supports the X beam 73X in the vertical direction (Z-axis direction) through static pressure air bearings. A Y guide 76 attached to the slider surface plate 75 guides the X foot 74X' in the horizontal direction (Y-axis direction) through static pressure air bearings (not shown). The slider surface plate 75 supports the X-Y slider 72 in the vertical direction (Z-axis direction) through a static pressure air bearing (not shown) attached to its bottom surface.

FIG. 11A is a plan view seen from above the fine stage 70, FIG. 11B is a plan view seen from above a fine stage fixed plate 702, and FIG. 11C is a plan view seen from below a top plate 701. The fine stage 70 comprises the fine stage fixed plate 702 and top plate 701. A self-weight support spring (not shown) extends between the fine stage fixed plate 702 and top plate 701 to support the weight of the top plate 701. Fine linear motors are arranged between the fine stage fixed plate 702 and top plate 701. Stators 703Xa, 703Ya, and 703Za of the fine linear motors which have coils fixed to the fine stage fixed plate 702. Movable elements 703Xb, 703Yb, and 703Zb of the fine linear motors which have magnets are fixed to the top plate 701. The stators 703Xa and movable elements 703Xb generate thrusts in the X direction. The stators 703Ya and movable elements 703Yb generate thrusts in the Y direction. The stators 703Za and movable elements 703Zb generate thrusts in the Z direction.

Magnetic plates 705 are arranged on the side surfaces of the four sides of the top plate 701 through attaching plates 704. E-shaped electromagnets 707 having coils are arranged on the fine stage fixed plate 702 through attaching plates. When supplying a current to the coils, attracting forces are generated between the E-shaped electromagnets 707 and magnetic plates 705 to transmit the acceleration/deceleration force of the X-Y slider 72 to the top plate 701. The E-shaped electromagnets 707 and magnetic plates 705 thus serve as electromagnetic couplings. The opposing surfaces of the E-shaped electromagnets 707 and magnetic plates 705 form arcs having their centers at the rotation center of the top plate 701. By employing this arc shape, the E-shaped electromagnets 707 and magnetic plates 705 can rotate freely about the Z-axis without coming into contact with each other. During rotation, the gaps between the E-shaped electromagnets 707 and magnetic plates 705 do not change, and the attracting forces generated by the electromagnets with respect to same current do not change. The lines of action generated between the E-shaped electromagnets 707 and magnetic plates 705 preferably run through the barycentric position of the whole movable body of the fine stage 70 including the top plate 701, the linear motors attaching to it, and the like.

The top plate 701 has a hollow rib structure to decrease the weight and increase the rigidity. FIG. 12 is a sectional view showing a typical rib structure. In FIG. 12, ribs R701 form a rhombus. As disclosed in Japanese Patent Laid-Open No. 2003-163257, this can increase the natural value of the torsion mode as the primary mode of the top plate 701 to obtain high-speed, high-accuracy followability of the stage.

In recent years, higher-speed positioning has been required, and accordingly further weight reduction has been required of the top plate as part of the movable portion of a fine stage. For this purpose, a thickness t701 of each rib R701 as shown in FIG. 12 must be decreased as much as possible. If, however, the rib is excessively thin, even if the natural value of the global mode such as the torsion of the top plate may be maintained, the natural value of the local mode of the rib itself as indicated by broken lines in FIG. 12 decreases to adversely affect the followability of the stage.

Japanese Patent Laid-Open No. 2004-254489 discloses a plane stage in which driving forces in the direction of six degrees of freedom are generated between the coils of the stator and the magnets of the movable element to realize a large stroke, high-accuracy positioning, and high-accuracy posture control. A top plate for such a plane stage preferably comprises a three-pin support mechanism to transfer a wafer from a transfer hand to a chuck held by the top plate. This increases the thickness of the top plate. Accordingly, the natural value of the local mode of the rib further decreases, and boring to form the rib becomes difficult.

SUMMARY OF THE INVENTION

The present invention has been made in view of the above background, and has as its object, for example, in a top plate having a rib, to increase the natural value of the local mode of the rib, or decrease the weight of the top plate by decreasing the weight of the rib.

The first aspect of the present invention is directed to a top plate configured to surround a space with a first plate member and a second plate member which oppose each other and a side wall member, comprising a rib arranged in the space, wherein the rib includes a plurality of connecting portions, each of the plurality of connecting portions connects to either one of the side wall member and a member in the space, and the rib has a thickness at a portion between adjacent ones of the connecting portions which is larger than a thickness at each of the adjacent ones of the connecting portions.

According to a preferred embodiment of the present invention, the member in the space comprises, e.g., a second rib.

According to a preferred embodiment of the present invention, the rib can be formed such that its thickness changes continuously.

According to a preferred embodiment of the present invention, the rib can include a thick portion between the adjacent ones of the connecting portions which is thicker than the thickness of each of the adjacent ones of the connecting portions. For example, the thick portion can include a column shape. The thick portion can be formed such that its height is smaller than a distance between the first plate member and the second plate member. For example, the thick portion includes a column-shaped portion for fixing, and a screw can fasten either one of the first plate member and the second plate member to the column-shaped portion.

The second aspect of the present invention is directed to a top plate including a first member and a second member, wherein the first member and the second member include ribs, respectively, and at least either one of the rib of the first member and the rib of the second member includes a flange with an increased thickness to connect the rib of the first member to the rib of the second member.

According to a preferred embodiment of the present invention, the second member can be formed by connecting an opened hollow member having two open sides and a plate member.

According to a preferred embodiment of the present invention, the flange can be formed on the rib of the first member.

According to a preferred embodiment of the present invention, the top plate can incorporate a pin support mechanism.

The third aspect of the present invention is directed to a top plate including a first member and a second member, wherein the first member and the second member include ribs, respectively, and the rib of the first member and the rib of the second member connect to each other.

According to a preferred embodiment of the present invention, the second member can be formed by connecting an opened hollow member having two open sides and a plate member.

The fourth aspect of the present invention is directed to a positioning apparatus comprising a top plate that is specified by either one of the first aspect, the second aspect, and the third aspect, and a driving portion which drives the top plate.

The fifth aspect of the present invention is directed to an exposure apparatus comprising the positioning apparatus described above, wherein the positioning apparatus positions either one of a substrate and an original.

The sixth aspect of the present invention is directed to a device manufacturing method comprising a step of forming a latent pattern on a photosensitive agent on a substrate by the exposure apparatus described above, and a step of developing the photosensitive agent.

According to the present invention, for example, in a top plate having a rib, the natural value of the local mode of the rib is increased, or the weight of the top plate is decreased by decreasing the weight of the rib.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments to practice the present invention will be described hereinafter with reference to the accompanying drawings.

First Embodiment

Figure 1A:
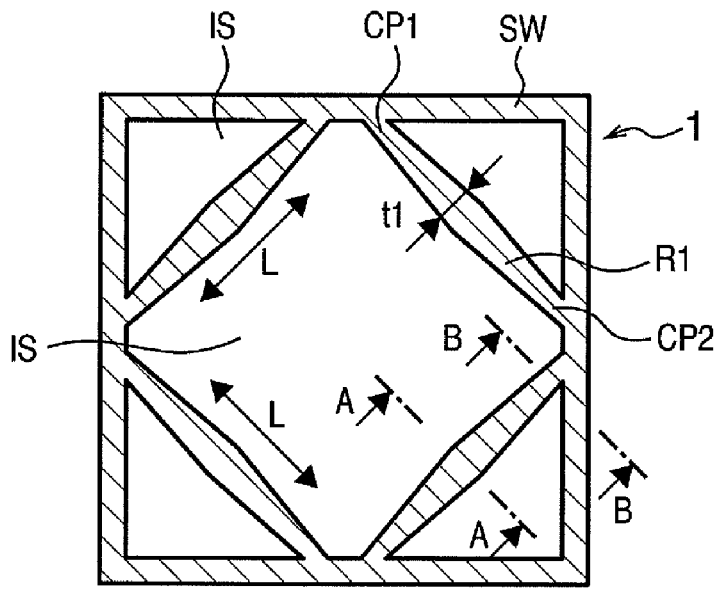
FIGS. 1A, 1B, and 1C are sectional views showing the arrangement of a hollow top plate according to the first embodiment of the present invention.
Figures 1B, 1C:
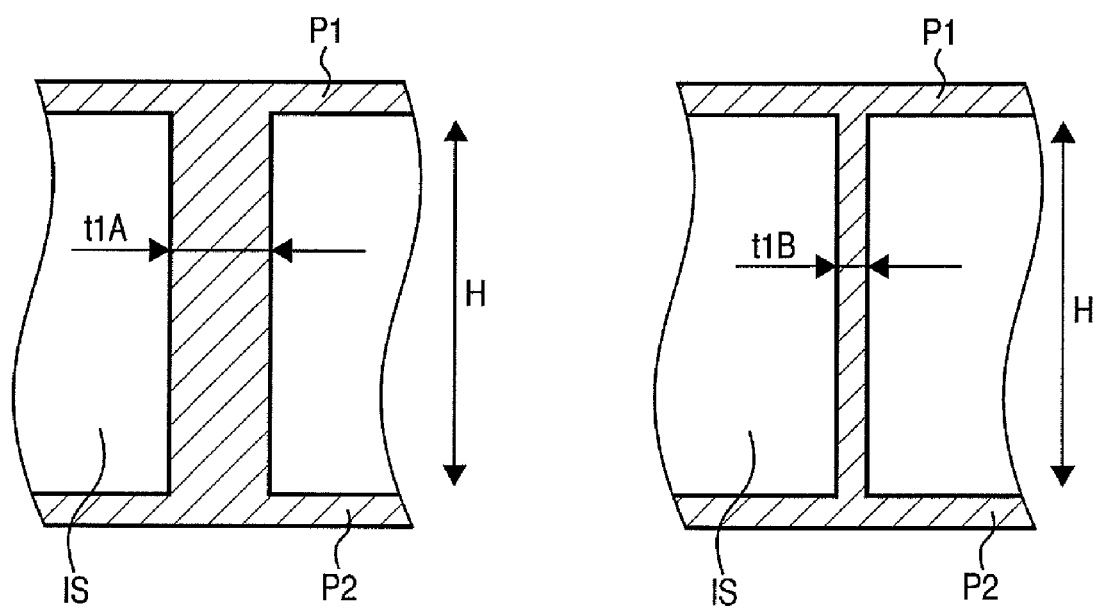
Figure 2:
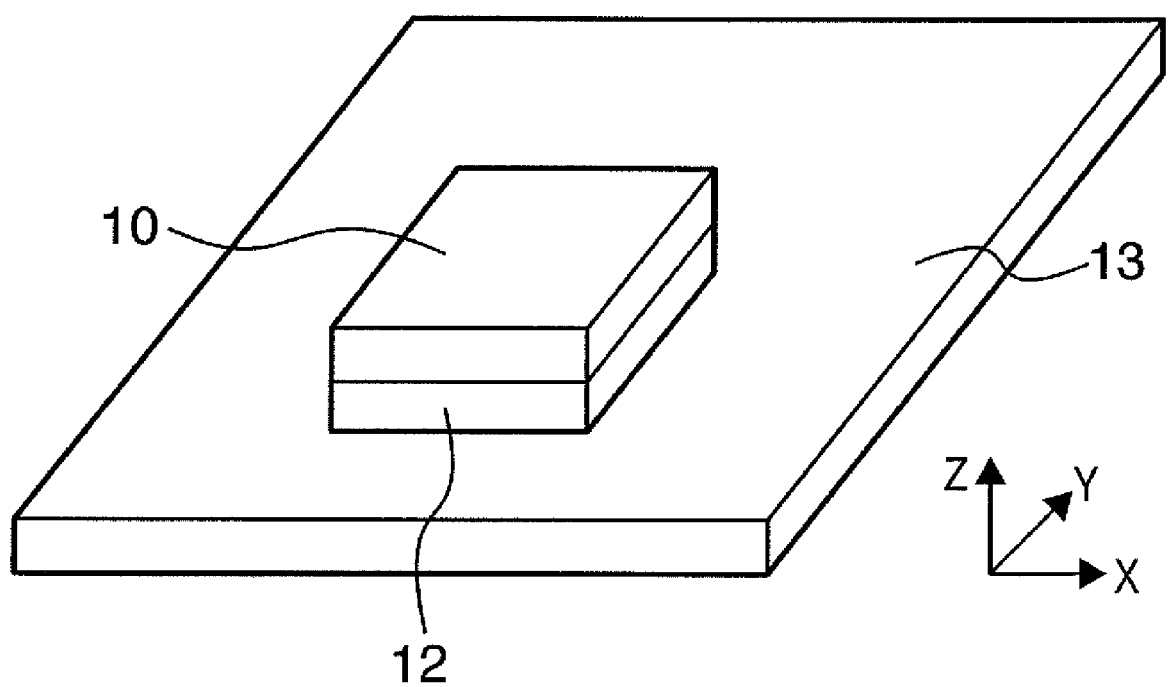
FIG. 2 is a perspective view showing the schematic arrangement of a wafer stage apparatus (positioning apparatus) having a fine stage including the top plate shown in FIGS. 1A to 1C.

FIGS. 1A to 1C are sectional views showing the arrangement of a hollow top plate according to the first embodiment of the present invention, in which FIG. 1A is a sectional view taken along a plane parallel to the upper or lower surface of a hollow top plate 1, FIG. 1B is a sectional view taken along the line A-A of FIG. 1A, and FIG. 1C is a sectional view taken along the line B-B of FIG. 1A. FIG. 2 is a perspective view showing the schematic arrangement of a wafer stage apparatus (positioning apparatus) having a fine stage including the hollow top plate 1 shown in FIGS. 1A to 1C.

The wafer stage apparatus comprises a platen 13, X-Y slider 12, and six-axis fine stage 10. The platen 13 has teeth at predetermined pitches. The X-Y slider 12 is configured to move along the upper surface of the platen 13, and has projecting poles at predetermined pitches. The platen 13 serving as a stator and the X-Y slider 12 serving as a movable element constitute a guideless plane pulse motor. For example, Japanese Patent Laid-Open No. 2005-269763 discloses a guideless plane pulse motor.

Figure 11A:
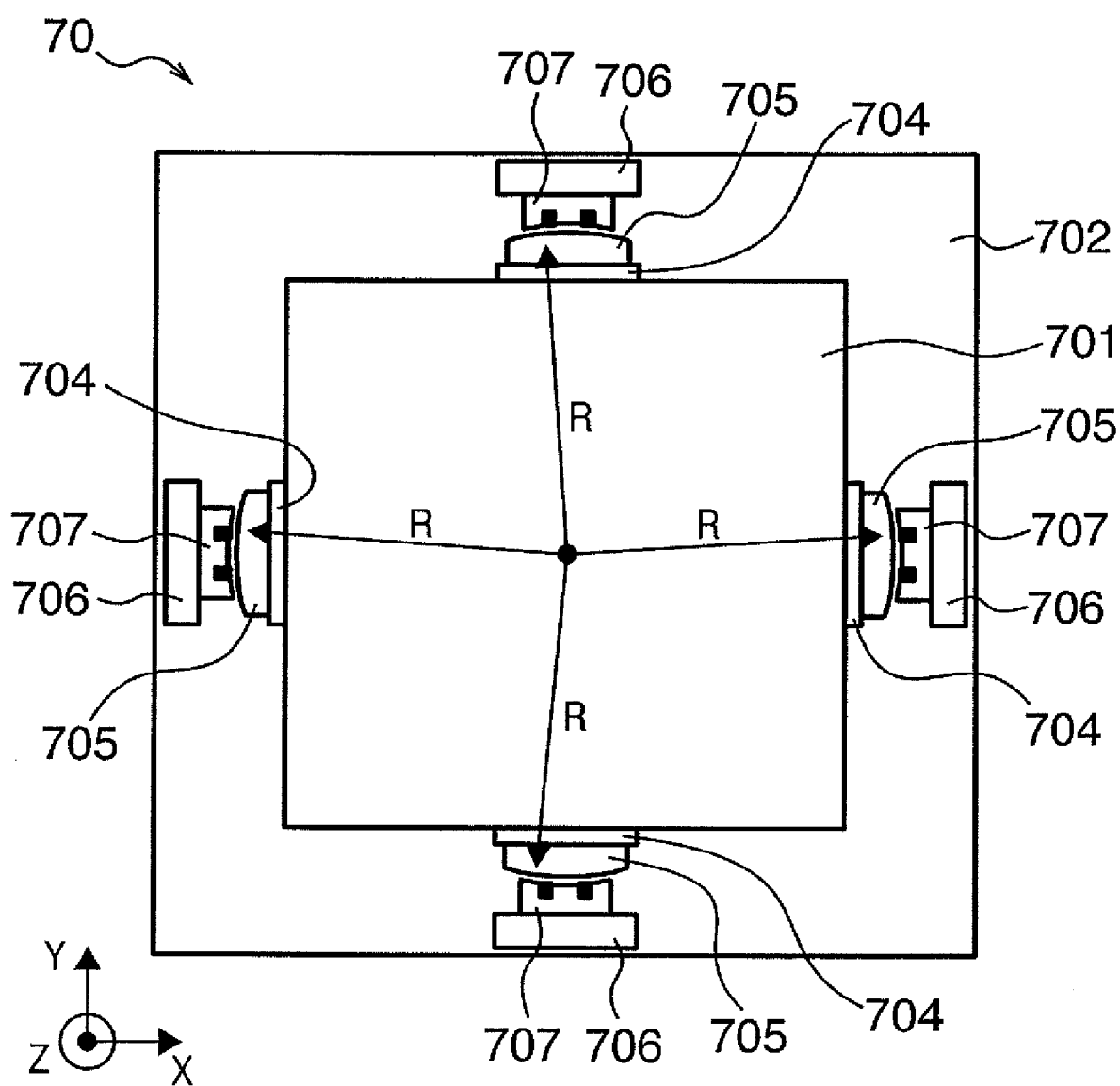
FIG. 11A is a plan view seen from above a fine stage.
Figure 11B:
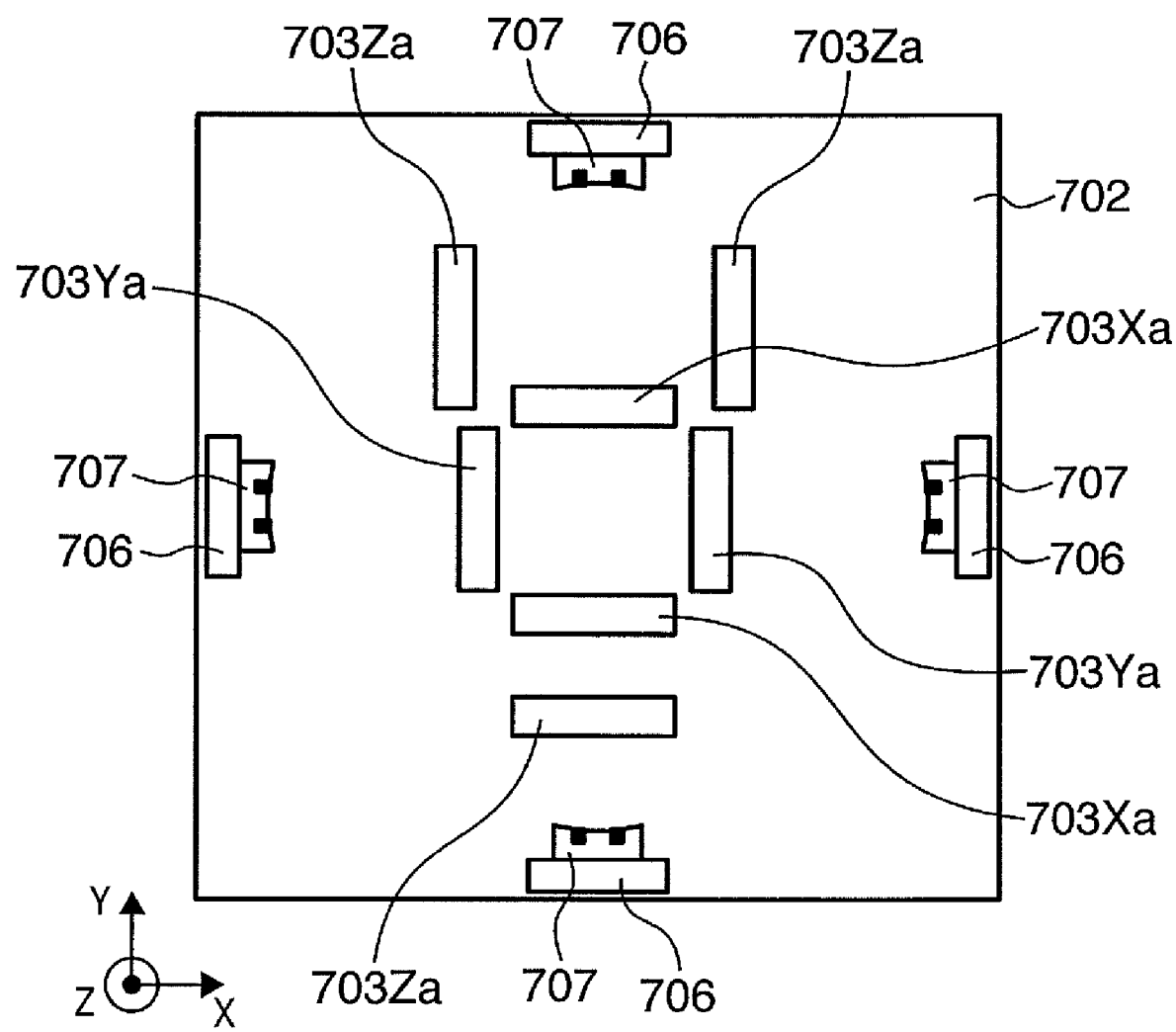
FIG. 11B is a plan view seen from above a fine stage fixed plate.
Figure 11C:
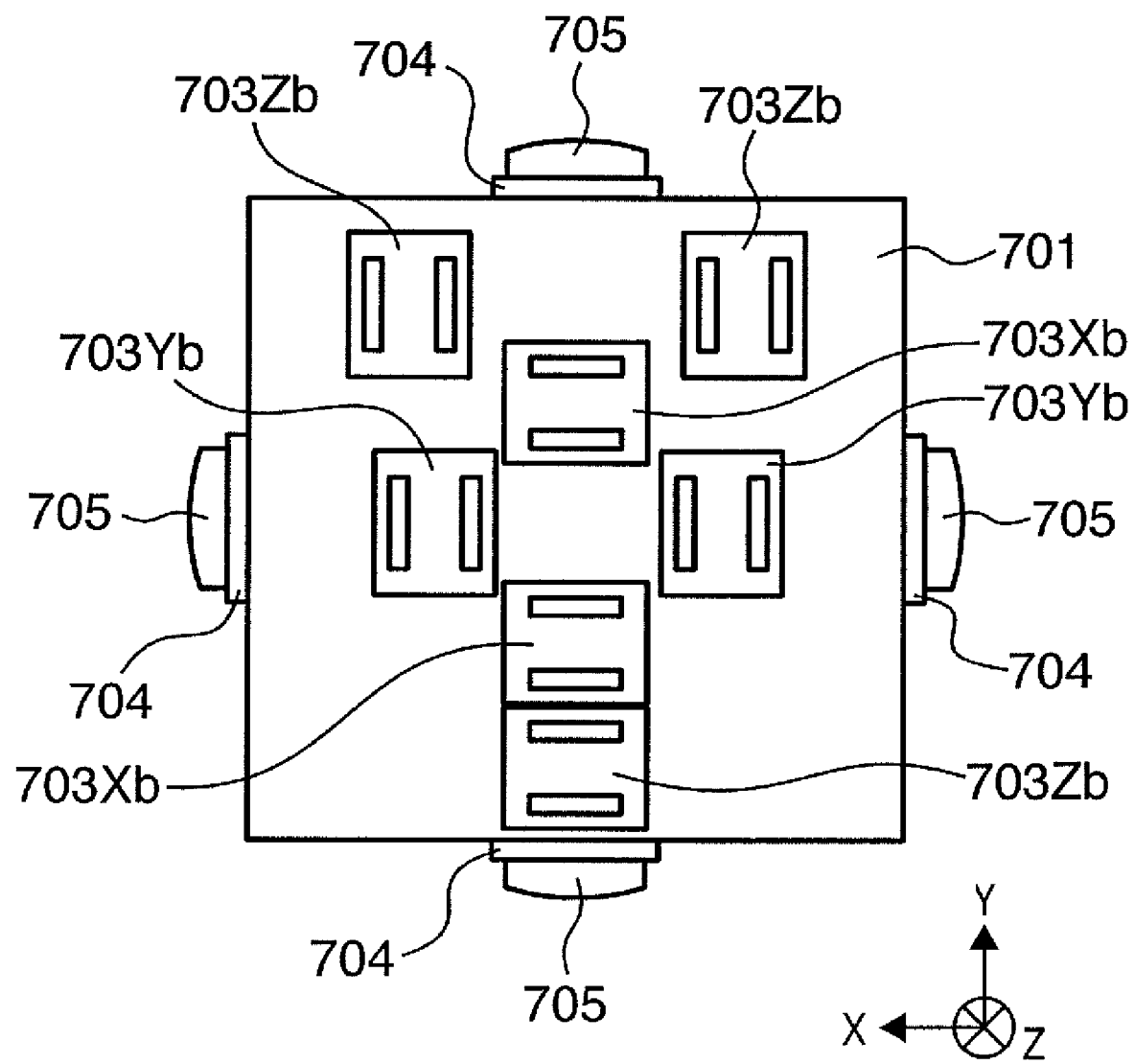
FIG. 11C is a plan view seen from below a top plate.

The X-Y slider 12 injects compressed air from its lower surface. Thus, the X-Y slider 12 levitates with respect to the platen 13. The six-axis fine stage 10 as shown in FIGS. 11A to 11C is mounted on the X-Y slider 12. By employing the guideless plane pulse motor as a coarse linear motor, the arrangement of the coarse stage becomes simple to realize a compact size, light weight, and high throughput.

The hollow top plate 1 is used as the top plate (corresponding to the top plate 701 of FIGS. 11A to 11C) of the six-axis fine stage 10. The hollow top plate 1 surrounds an internal space IS with a first plate member P1 and second plate member P2 which oppose each other and a side wall member SW, and has a hollow structure. Typically, the first plate member P1 and second plate member P2 have rectangular shapes, and the side wall member SW has a frame shape formed by four sides.

Ribs R1 are arranged in the internal space IS to form a rib structure. In the embodiment shown in FIGS. 1A to 1C, the hollow top plate 1 has four ribs R1. The rib structure including the four ribs R1 has a rhombic shape having a vertex at the middle portion (the portion between one and the other ends of a side) of the side wall member SW. This rib structure increases the natural value of the torsion mode as the primary mode of the hollow top plate 1.

Each rib R1 includes two connecting portions CP1 and CP2. The two connecting portions CP1 and CP2 connect to the side wall member SW. Each rib R1 may alternatively include three or more connecting portions. In this case, the three or more connecting portions can include the connecting portions CP1 and CP2 which connect to the side wall member SW, as well as another rib (second rib).

In at least one rib R1 and preferably in each of all the ribs R1, a thickness t1 is not constant in a longitudinal direction L, and a thickness t1A at a portion (central portion) between the adjacent connecting portions CP1 and CP2 is larger than a thickness t1B at each of the adjacent connecting portions CP1 and CP2. In the embodiment shown in FIGS. 1A to 1C, the adjacent connecting portions are the connecting portions CP1 and CP2. For example, if a connecting portion CP3 exists between the connecting portions CP1 and CP2, the adjacent connecting portions are the connecting portions CP1 and CP3, or the connecting portions CP2 and CP3. For example, the rib R1 can have such a shape that its thickness t1 continuously increases from each of the adjacent connecting portions CP1 and CP2 toward the central portion between the adjacent connecting portions CP1 and CP2.

In this specification, the rib longitudinal direction L signifies a direction to connect the connecting portions. The rib thickness t1 signifies the dimension of the rib in a direction perpendicular to the longitudinal direction L in a plane parallel to the upper and lower surfaces of the hollow top plate 1. A rib height H signifies the rib dimension in a direction that specifies the gap between the first plate member P1 and second plate member P2.

Figure 12:
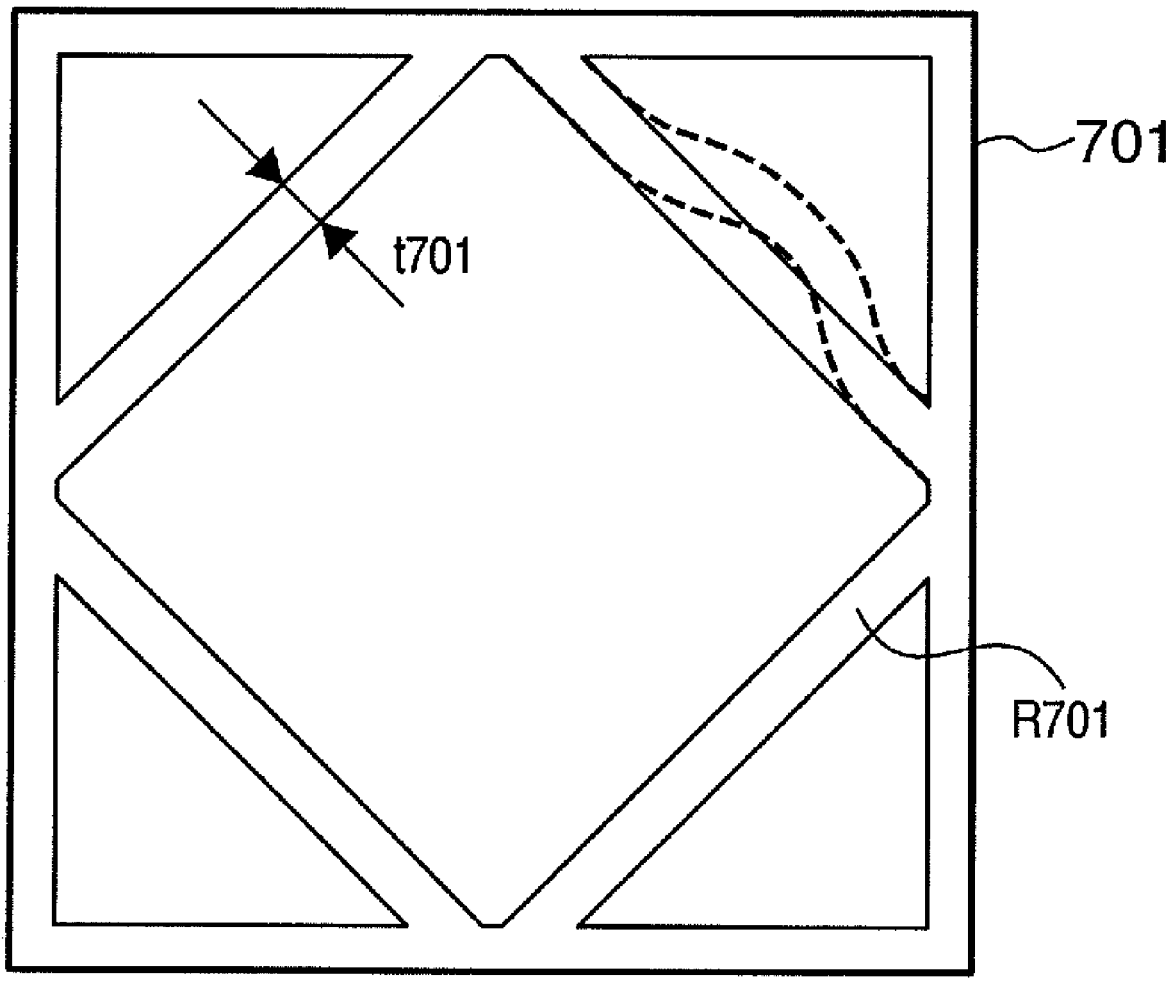
FIG. 12 is a sectional view showing the rib structure of the hollow top plate of a wafer stage according to a prior art.

By employing the rib R1 having such a shape that the thickness t1A at the central portion between the adjacent connecting portions CP1 and CP2 is larger than the thickness t1B at each of the adjacent connecting portions CP1 and CP2, the rigidity of the central portion increases. For example, assume that the rib of the first embodiment will be compared with a rib having a constant thickness as shown in FIG. 12. When the masses of the two ribs are equal, the natural value of the local mode of the rib is higher in the first embodiment as indicated by the broken lines in FIG. 12, to improve the adverse effect on the followability of the stage. From another point of view, this signifies that the first embodiment can decrease the mass of the rib without decreasing the natural value of the local mode of the rib. As a result, the weight of the fine stage can be decreased to increase the throughput of the positioning apparatus.

Second Embodiment

Figure 3:
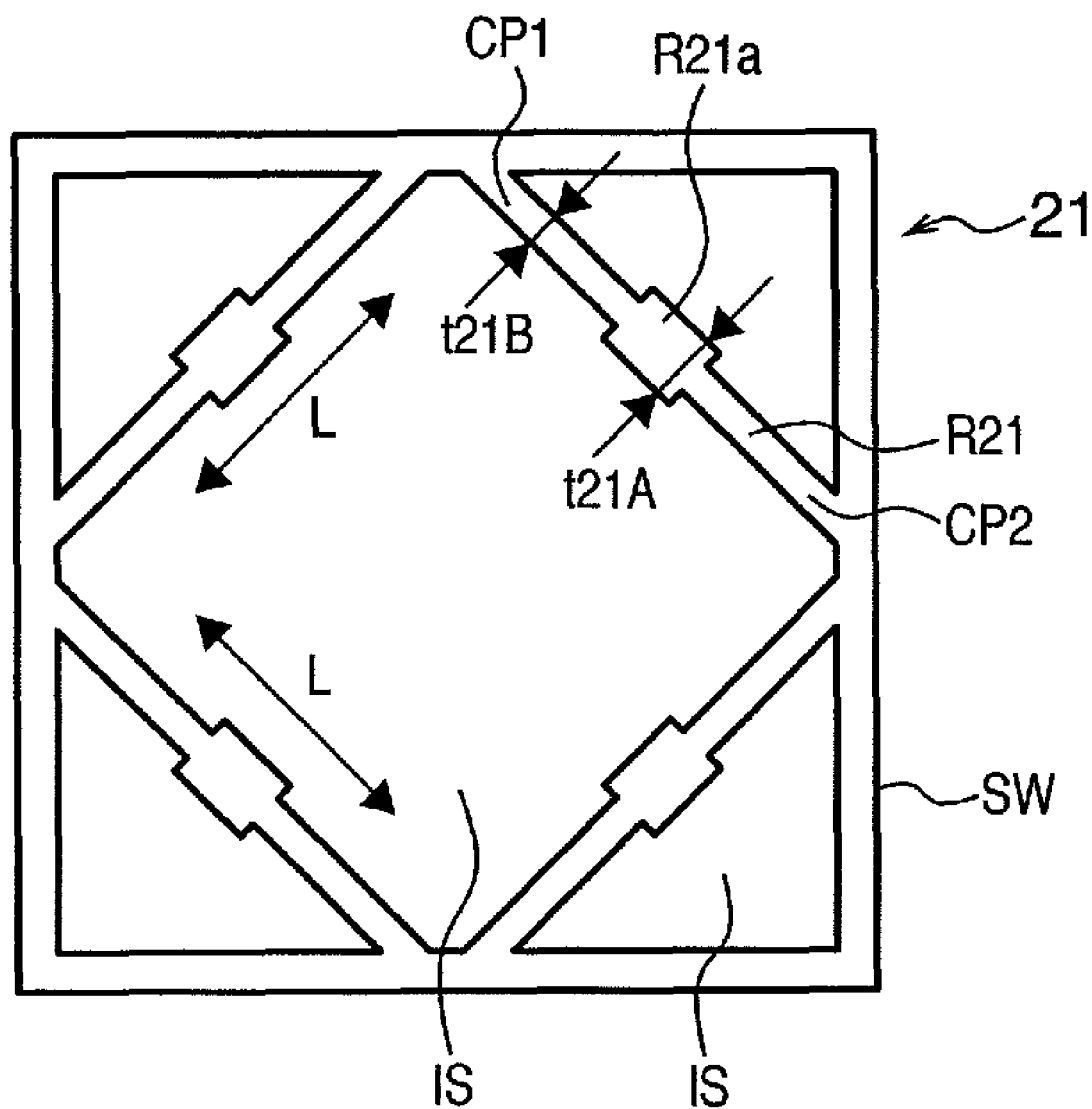
FIG. 3 is a sectional view showing the arrangement of a hollow top plate according to the second embodiment of the present invention.

FIG. 3 is a sectional view showing the arrangement of a hollow top plate according to the second embodiment of the present invention. Matters that are not particularly referred to can follow the first embodiment.

A hollow top plate 21 is used as the top plate (corresponding to the top plate 701 in FIGS. 11A to 11C) of a six-axis fine stage 10. The hollow top plate 21 surrounds an internal space IS with opposing first and second plate portions and a side wall member SW and has a hollow structure. Typically, the first and second plate members have rectangular shapes, and the side wall member SW has a frame shape formed by four sides.

In the embodiment shown in FIG. 3, the hollow top plate 21 has four ribs R21. The rib structure including the four ribs R21 has a rhombic shape having a vertex at the middle portion (a portion between one and the other ends of a side) of the side wall member SW. This rib structure increases the natural value of the torsion mode as the primary mode of the hollow top plate 21.

At least one rib R21 and preferably each of all the ribs R21 has a thick portion R21a at a portion (central portion) between adjacent connecting portions CP1 and CP2. Accordingly, in the rib R21, a thickness t21A at the portion (central portion) between the adjacent connecting portions CP1 and CP2 is larger than a thickness t21B at each of the adjacent connecting portions CP1 and CP2. The thick portion R21a can be formed such that its thickness throughout the entire portion between the first and second plate members is larger than the thickness at each of the connecting portions CP1 and CP2. The thick portion R21a can have a column shape, e.g., a polygonal column shape.

This structure can also increase the natural value of the local mode of the rib, or decrease the mass of the rib without decreasing the natural value of the local mode of the rib.

Third Embodiment

Figure 4:
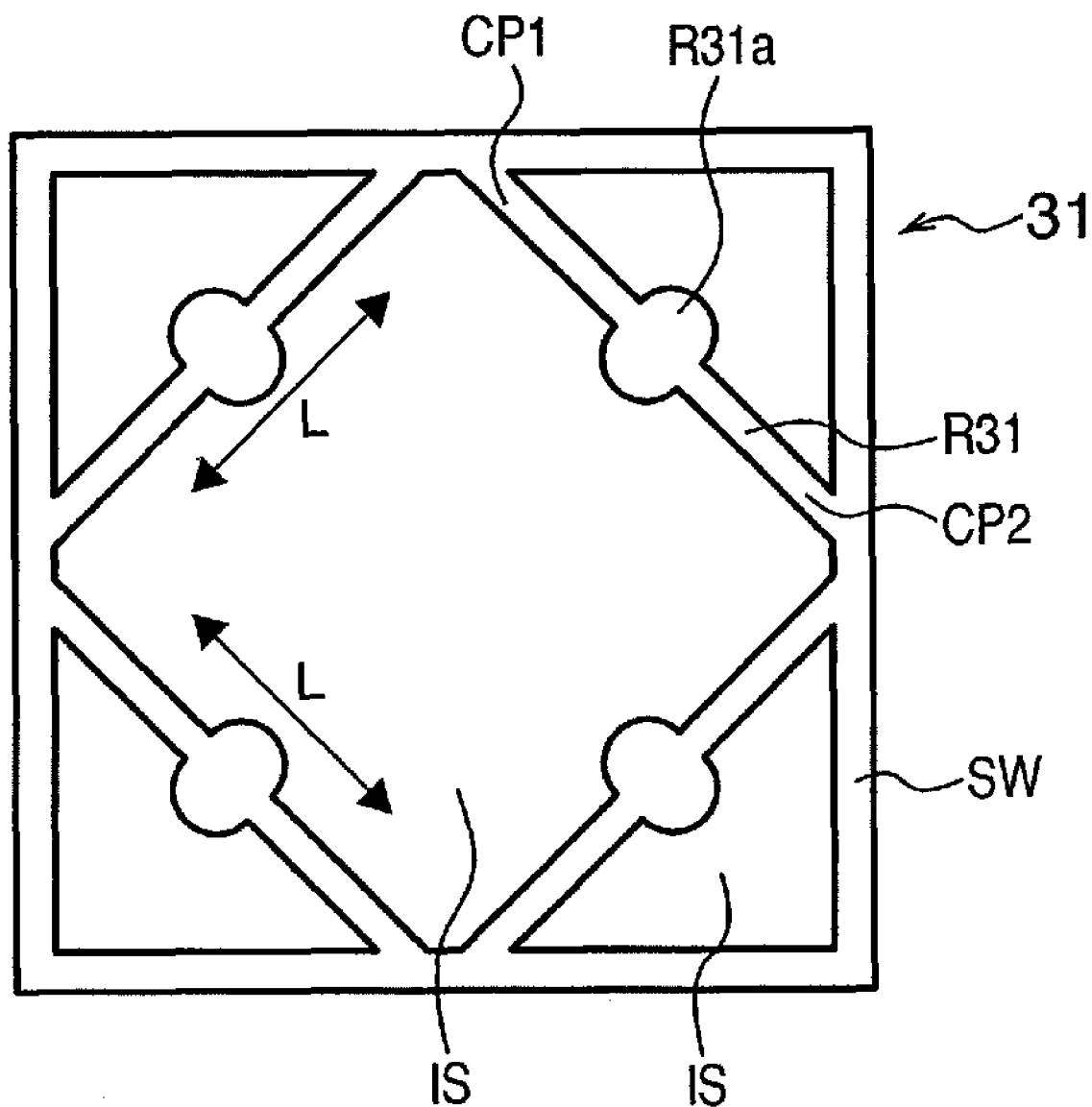
FIG. 4 is a sectional view showing the arrangement of a hollow top plate according to the third embodiment of the present invention.

FIG. 4 is a sectional view showing the arrangement of a hollow top plate according to the third embodiment of the present invention. Matters that are not particularly referred to can follow, e.g., the first or second embodiment.

A hollow top plate 31 is used as the top plate (corresponding to the top plate 701 in FIGS. 11A to 11C) of a six-axis fine stage 10. The hollow top plate 31 surrounds an internal space IS with opposing first and second plate portions and a side wall member SW, and has a hollow structure. Typically, the first and second plate members have rectangular shapes, and the side wall member SW has a frame shape formed by four sides.

In the embodiment shown in FIG. 4, the hollow top plate 31 has four ribs R31. The rib structure including the four ribs R31 has a rhombic shape having a vertex at the middle portion (a portion between one and the other ends of a side) of the side wall member SW. This rib structure increases the natural value of the torsion mode as the primary mode of the hollow top plate 31.

At least one rib R31 and preferably each of all the ribs R31 has a column-shaped thick portion R31a at a portion (central portion) between adjacent connecting portions CP1 and CP2. Accordingly, in the rib R31, the thickness at the portion (central portion) between the adjacent connecting portions CP1 and CP2 is larger than the thickness at each of the adjacent connecting portions CP1 and CP2. The column shape refers to a shape having a section such as a circle or ellipse which is formed by a closed curve. The thick portion R31a can be formed such that its thickness throughout the entire portion between the first and second plate members is larger than the thickness at each of the connecting portions CP1 and CP2.

This structure can also increase the natural value of the local mode of the rib, or decrease the mass of the rib without decreasing the natural value of the local mode of the rib.

Fourth Embodiment

Figure 5:
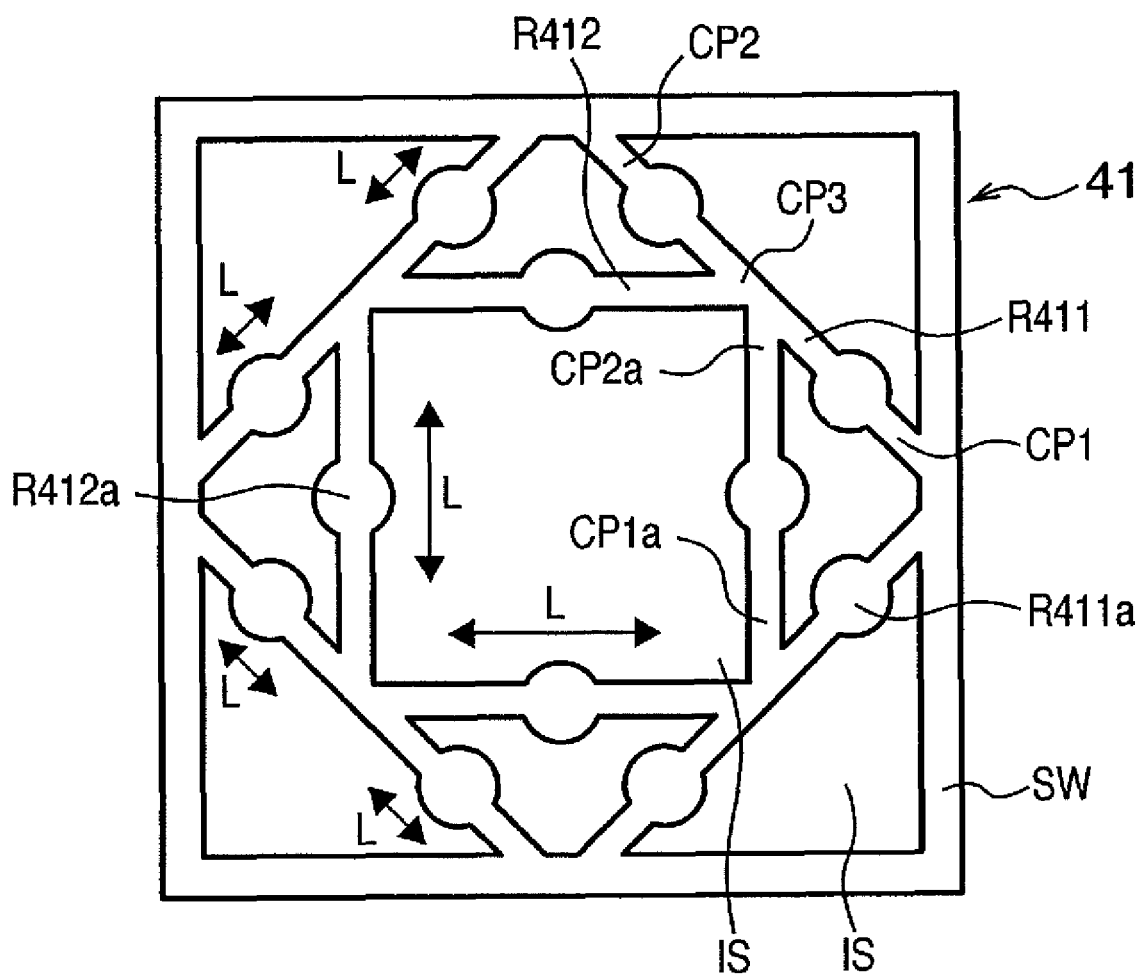
FIG. 5 is a sectional view showing the arrangement of a hollow top plate according to the fourth embodiment of the present invention.

FIG. 5 is a sectional view showing the arrangement of a hollow top plate according to the fourth embodiment of the present invention. Matters that are not particularly referred to can follow, e.g., each of the first to third embodiments.

A hollow top plate 41 is used as the top plate (corresponding to the top plate 701 in FIGS. 11A to 11C) of a six-axis fine stage 10. The hollow top plate 41 surrounds an internal space IS with opposing first and second plate portions and a side wall member SW, and has a hollow structure. Typically, the first and second plate members have rectangular shapes, and the side wall member SW has a frame shape formed by four sides.

In the embodiment shown in FIG. 5, the hollow top plate 41 has four ribs R411 which form a first rhombus having a vertex at the middle portion (a portion between one and the other end of a side) of the side wall member SW. The hollow top plate 41 further has four ribs R412, inside the first rhombus, which form a second rhombus having vertices at middle portions of the four ribs R411, respectively. This rib structure increases the natural value of the torsion mode as the primary mode of the hollow top plate 41.

In the fourth embodiment, each of the ribs R411 which form the first rhombus has a connecting portion CP3, which connects to the corresponding rib R412 that forms the second rhombus, at a portion (central portion) between connecting portions CP1 and CP2 which connect to the side wall member SW. At least one rib R411 and preferably each of all the ribs R411 has a thick portion R411a at a portion (central portion) between the adjacent connecting portions CP1 and CP3, and another thick portion R411a at a portion (central portion) between the adjacent connecting portions CP2 and CP3. Accordingly, in the rib R411, each of the thickness at the portion (central portion) between the adjacent connecting portions CP1 and CP3 and the thickness at a portion (central portion) between the adjacent connecting portions CP2 and CP3 is larger than the thickness of each of the connecting portions CP1, CP2, and CP3.

At least one of the ribs R412 and preferably each of all the ribs R412 which form the second rhombus has a thick portion R412a at a portion (central portion) between adjacent connecting portions CP1a and CP2a. Accordingly, in the rib R412, the thickness at the portion (central portion) between the adjacent connecting portions CP1a and CP2a is larger than the thickness at each of the adjacent connecting portions CP1a and CP2a.

This structure can also increase the natural value of the local mode of the rib, or decrease the mass of the rib without decreasing the natural value of the local mode of the rib.

Fifth Embodiment

Figure 6:
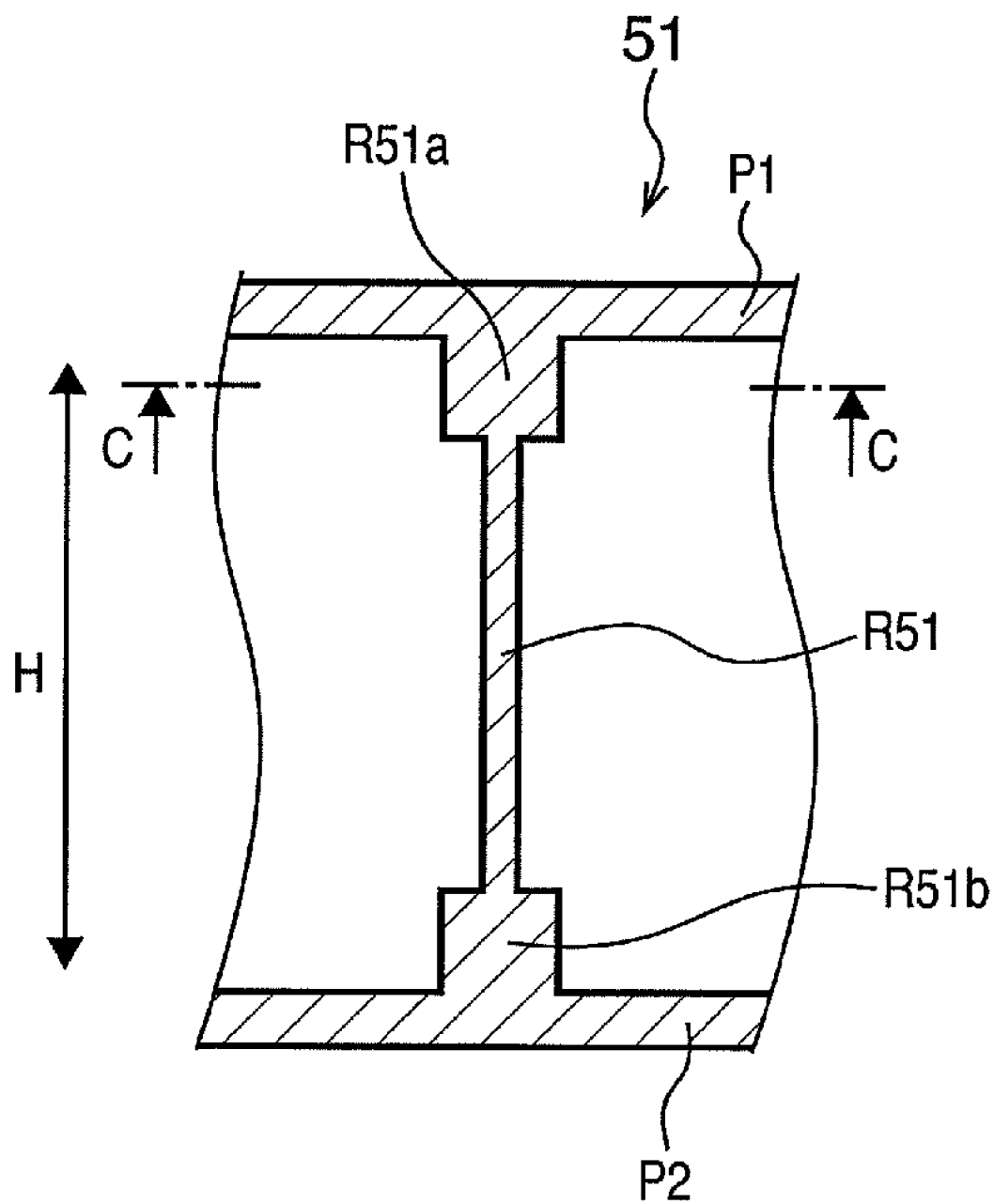
FIG. 6 is a sectional view showing the arrangement of a hollow top plate according to the fifth embodiment of the present invention.

FIG. 6 is a sectional view showing the arrangement of a hollow top plate according to the fifth embodiment of the present invention. FIG. 6 is a sectional view of a hollow top plate 51 taken along a line perpendicular to the longitudinal direction of a rib. The arrangement of a wafer stage apparatus having a fine stage including the hollow top plate 51 shown in FIG. 6 can follow the embodiment shown in FIG. 2. The section taken along the line C-C of FIG. 6 can follow FIG. 3 or 4.

In the fifth embodiment, thick portions R51a and R51b divide into a first plate member P1 side and second plate member P2 side, respectively, and connect to the first and second plate members P1 and P2, respectively. More specifically, in the fifth embodiment, the height of each of the thick portions R51a and R51b is smaller than the gap between the first and second plate members P1 and P2. This structure can also increase natural value of the local mode of a rib R51, or decrease the mass of the rib without decreasing the natural value of the local mode of the rib R51. If the rib R51 is sufficiently rigid, only either the thick portion R51a or R51b may need to be provided.

Sixth Embodiment

Figure 7A:
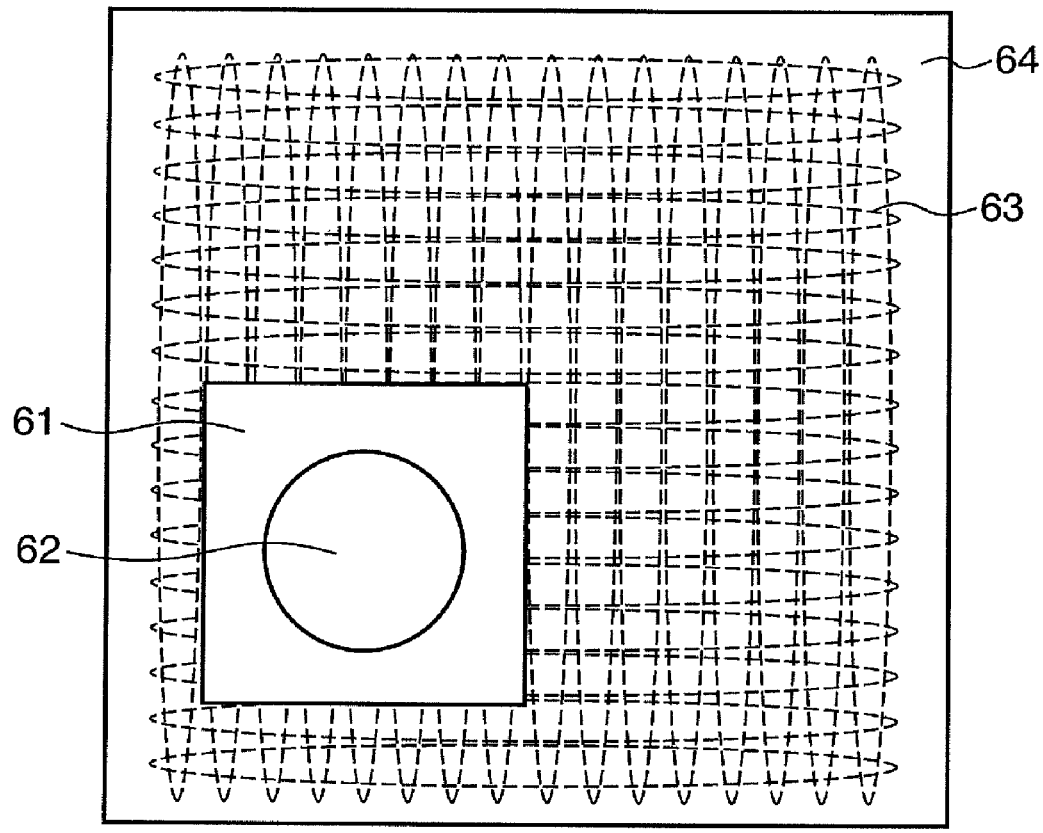
FIGS. 7A and 7B are a plan view and a side view, respectively, showing the arrangement of a wafer stage apparatus (positioning apparatus) according to the sixth embodiment of the present invention.
Figure 7B:
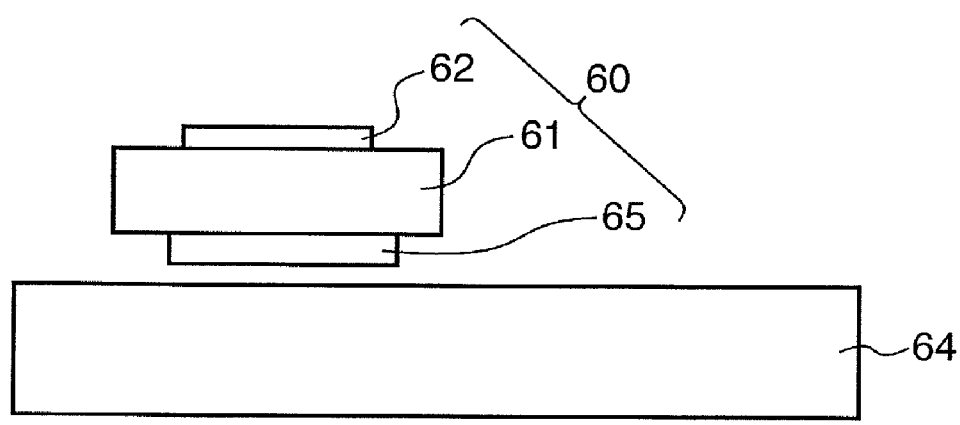

FIGS. 7A and 7B are sectional views showing the arrangement of a wafer stage apparatus (positioning apparatus) according to the sixth embodiment of the present invention, in which FIG. 7A is a plan view, and FIG. 7B is a side view.

The wafer stage apparatus shown in FIGS. 7A and 7B has a guideless six-axis plane motor as a driving portion which drives a movable element including a top plate. The wafer stage apparatus shown in FIGS. 7A and 7B comprises a stator 64 and a movable element 60 arranged on it. A driving coil group 63 is arranged on the stator 64 like a matrix. The movable element 60 has a hollow top plate 61, a chuck 62 arranged on the hollow top plate 61, and a permanent magnet group 65 arranged under the hollow top plate 61 like a matrix. By supplying a current to at least one driving coil of the driving coil group 63, the Lorentz force can drive the movable element 60 in six degrees of freedom. Japanese Patent Laid-Open No. 2004-254489 describes a wafer stage apparatus that has a guideless six-axis plane motor.

Figure 8:
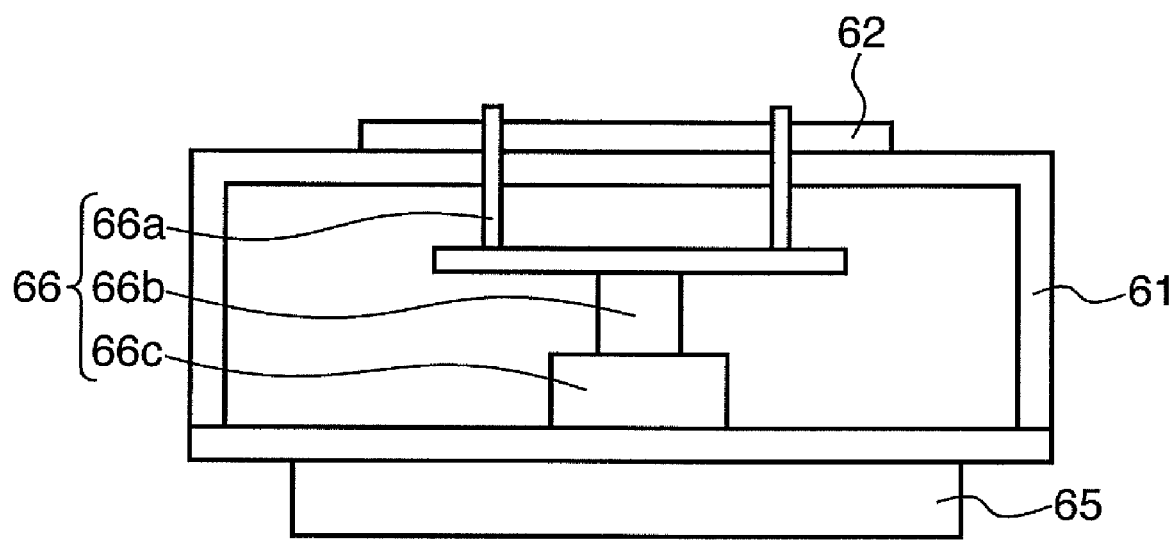
FIG. 8 is a cross-sectional view showing the arrangement of the movable element of the wafer stage apparatus according to the sixth embodiment of the present invention.

FIG. 8 is a cross-sectional view showing the schematic arrangement of the movable element 60. The movable element 60 incorporates, in the hollow top plate 61, a three-pin support mechanism 66 to receive a wafer from a transfer hand and transfer it to the chuck 62. The three-pin support mechanism 66 has three pins 66a, a guide 66b, and a driving source 66c. When a cam mechanism or the like converts a rotation force generated by, e.g., a compact rotary motor, into a linear driving force, the three-pin support mechanism 66 can vertically move the three pins 66a. The three pins 66a respectively have suction holes in them to hold the wafer.

In the plane stage apparatus as in this embodiment, the hollow top plate 61 moves through a long distance with respect to the stator 64, and it is difficult to provide the driving source 66c of the pins 66a outside the movable element 60.

Hence, the hollow top plate 61 is made thick to incorporate the three-pin support mechanism 66.

Figure 9A:
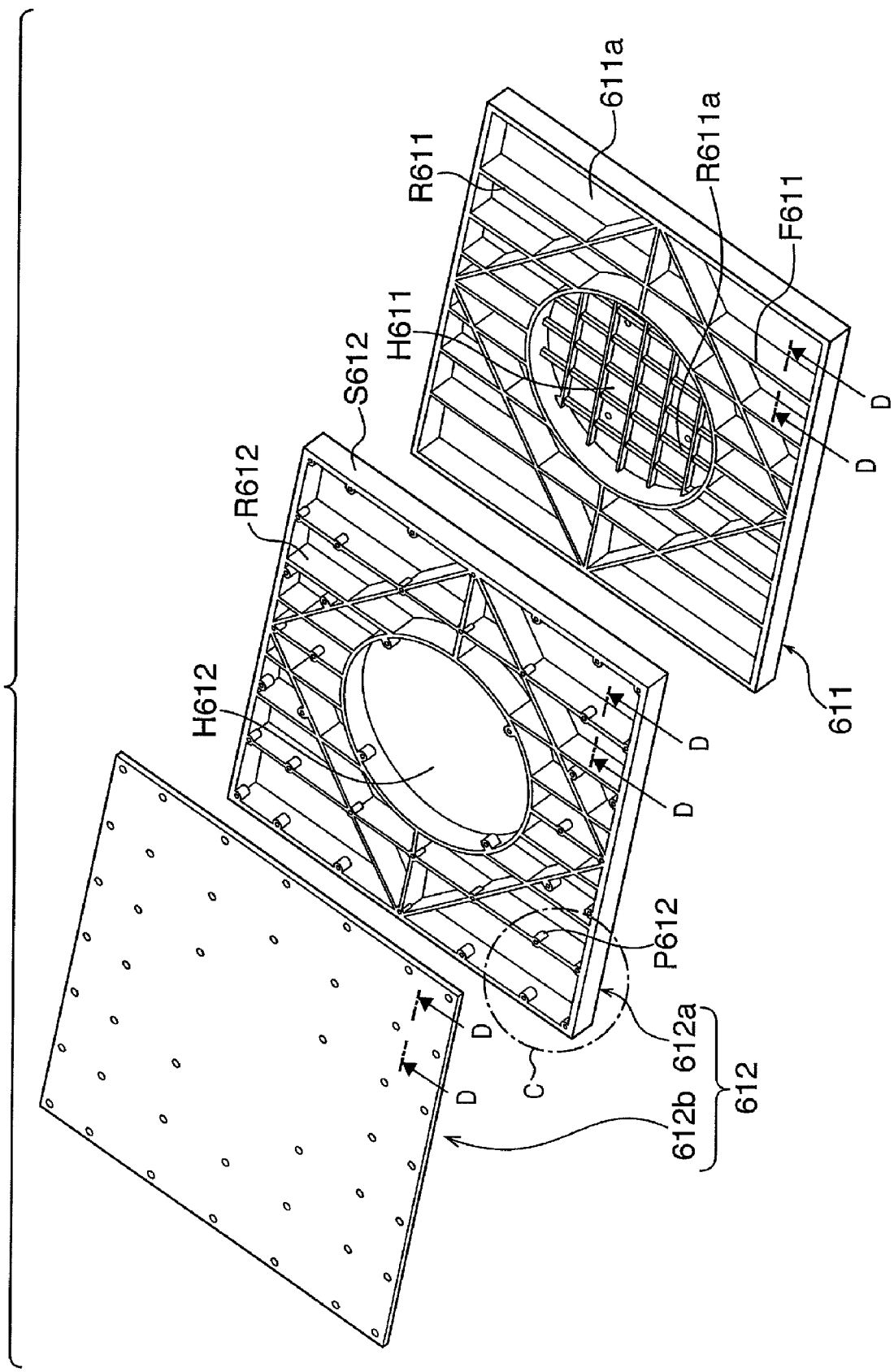
FIG. 9A is a divisional perspective view of the hollow top plate of a wafer stage apparatus according to the sixth embodiment of the present invention.
Figure 9B:
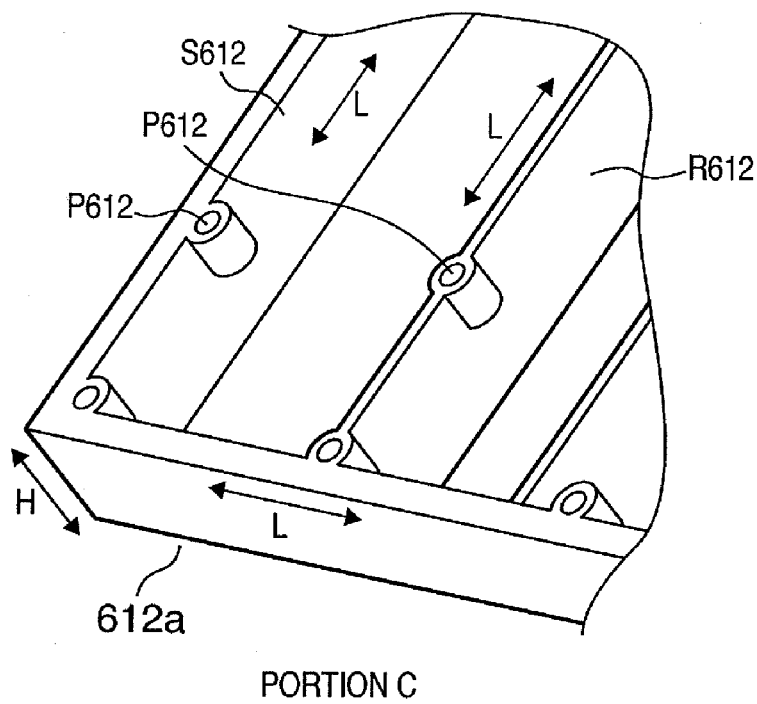
FIG. 9B is a partial enlarged view of the hollow top plate of the wafer stage apparatus according to the sixth embodiment of the present invention.
Figure 9C:
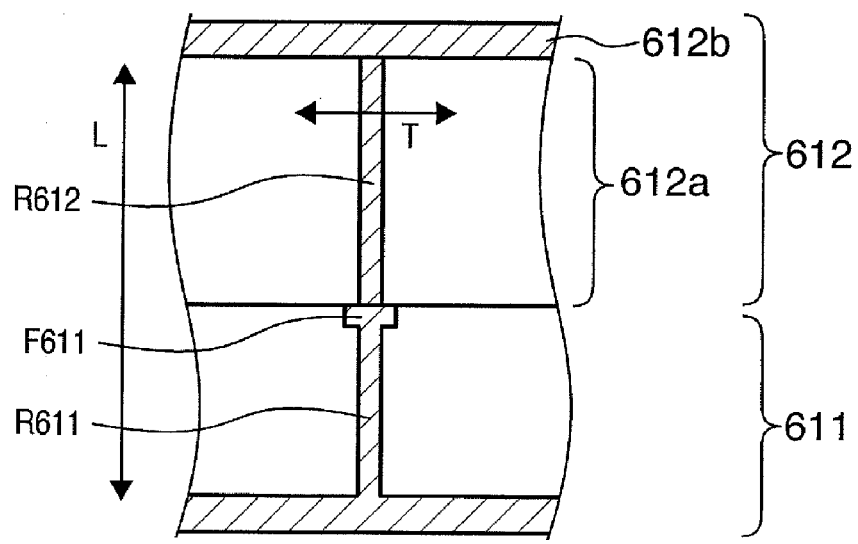
FIG. 9C is a cross-sectional view of a rib in the hollow top plate of the wafer stage apparatus according to the sixth embodiment of the present invention.
Figure 10:
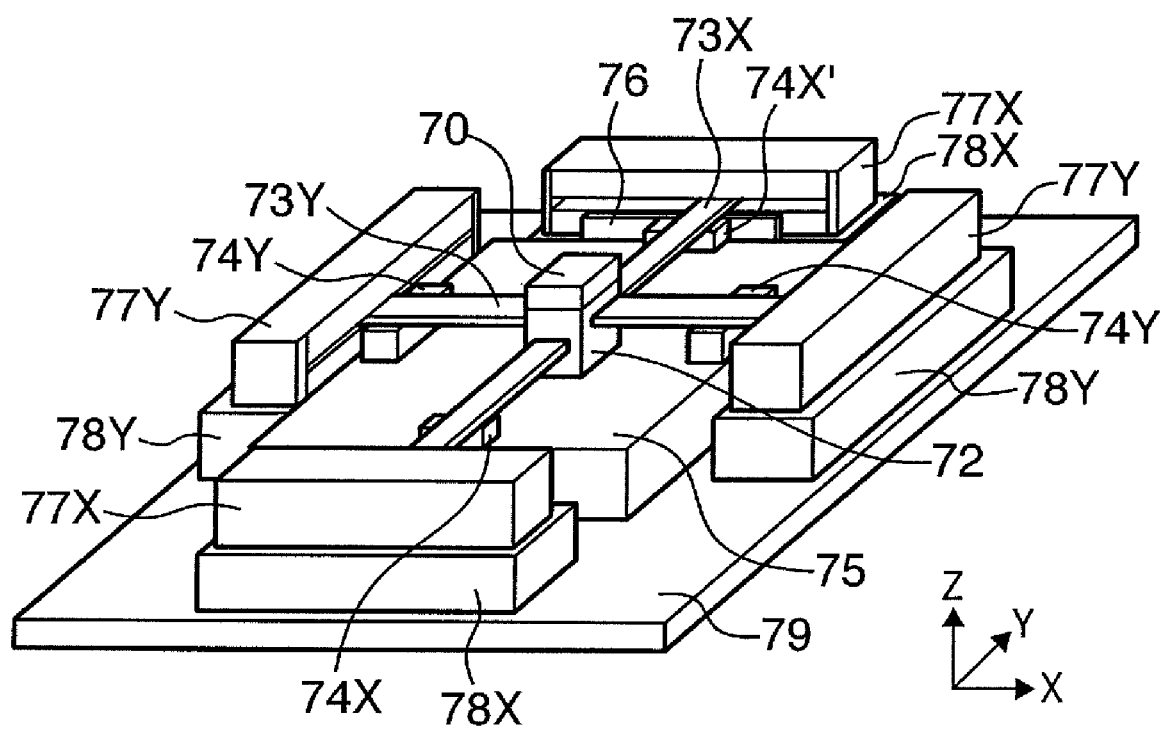
FIG. 10 is a perspective view of a wafer stage.

FIGS. 9A to 9C are views showing the hollow top plate 61 in detail, in which FIG. 9A is a divisional perspective view showing a state wherein the hollow top plate 61 is divided upside down. According to this embodiment, the thicknesses of ribs R611, R611a, and R612 are minimized as much as possible to reduce the weight of the hollow top plate 61.

The hollow top plate 61 can be formed by separately calcining first and second members 611 and 612 each forming a rib structure with one open side, and bonding the open sides, i.e., the ribs, after the calcination. As shown in, e.g., FIG. 9A, the second member 612 may further divide into a second plate member 612b and a rib structure 612a with two open sides, and the second plate member 612b and rib structure 612a may connect to each other with screws or the like. This aims at enabling removal of the second plate member 612b when maintaining the three-pin support mechanism 66 arranged in the hollow top plate 61.

A space H611 and space H612 surrounded by circular ribs serve to incorporate the three-pin support mechanism 66, and are provided with only the low ribs R611a that will not interfere with the three-pin support mechanism 66.

As shown in, e.g., FIG. 9B, the rib structure 612a has column-shaped portions P612 for fixing to fasten the second plate member 612b to the rib structure 612a with screws. The column-shaped portions P612 are formed in the ribs R612 and a side wall member S612 to have heights smaller than those of the ribs R612 and side wall member S612. This is due to the following reason. If the column-shaped portions P612 for fixing are formed to extend continuously between a first plate member 611a and the second plate member 612b of the hollow top plate 61, in the case of this embodiment in which the top plate 61 is thick, the heights of the columns increase, and the weight of the columns adversely affects.

The column-shaped portions P612 for fixing are preferably arranged between the adjacent connecting portions of the side wall member S612 or the adjacent connecting portions of the rib R612. This provides the effect of increasing the natural value of the local mode of the side wall member S612 or rib R612, as in the embodiments described above.

Alternately, the first member 611 and rib structure 612a may be integrally formed, and the integral body may be bored to form an opened hollow structure, and the opened hollow structure and the second plate member 612b may be calcined and bonded to each other to form a hollow top plate. It is, however, preferable to divide the hollow top plate into the first and second members 611 and 612, bore them separately, calcine them as two opened hollow structures, and thereafter connect them to each other. This is because if the thickness of the hollow top plate 61 increases to incorporate the three-pin support mechanism 66, the boring depth increases and makes integral machining difficult. The connecting portion of the rib R611 of the first member 611 and the rib R612 of the second member 612 preferably has a flange F611 with an increased rib thickness T, as shown in, e.g., FIG. 9C. This is because with the flange F611, even when misalignment occurs between the rib R611 of the first member 611 and the rib R612 of the second member 612, the first and second members 611 and 612 can be bonded reliably. Particularly, when the rib thickness is decreased to decrease the weight of the top plate, without the flange F611, even slight misalignment between the ribs R611 and R612 may disable them to be bonded to each other. The flange F611 may be formed on either one of the ribs R611 and R612. It is preferable that the flange F611 is formed on the rib R611, because it facilitates inspection of the bonding portion and furthermore reinforcement of bonding through the rib structure 612a having two open sides.

Other Embodiment

The present invention is not limited to the embodiments described above, but can also be applied to, e.g., an arrangement in which a fine stage which uses a plurality of uniaxial fine linear motors is mounted on a 2×2-matrix coarse stage which uses a plurality of uniaxial coarse linear motors. The present invention can also be applied to the hollow top plate of a wafer stage in which a fine stage which uses a six-axis plane Lorentz motor is placed on a coarse stage which uses a plane pulse motor.

Furthermore, the present invention can also be applied to the hollow top plate of not only a wafer stage but also a reticle stage to position, e.g., a reticle.

(Application)

Figure 13:
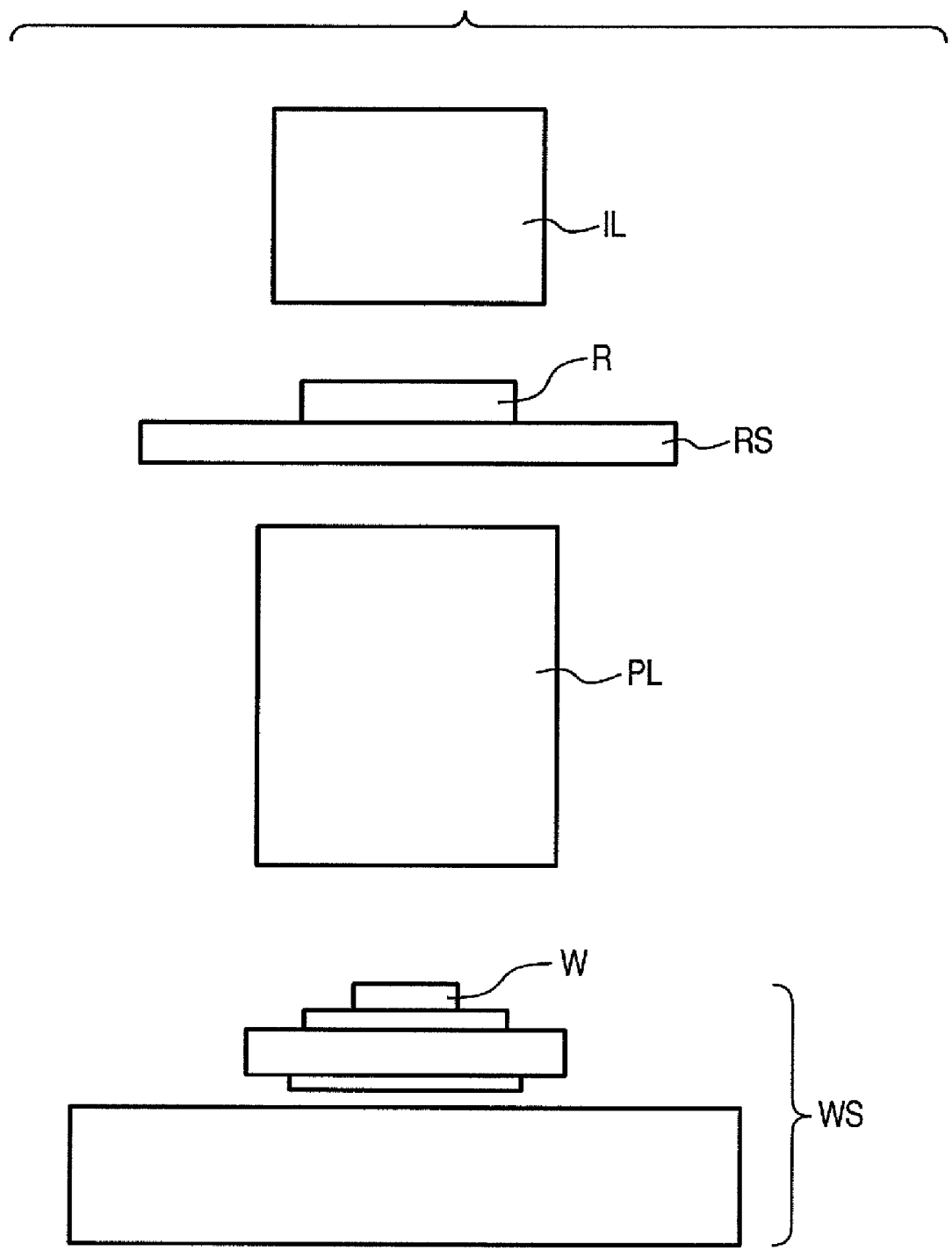
FIG. 13 is a view showing the schematic arrangement of an exposure apparatus according to a preferred embodiment of the present invention.

An embodiment as an application of a positioning apparatus according to the present invention which is exemplified by the embodiments described above will be described hereinafter. FIG. 13 is a view showing the schematic arrangement of an exposure apparatus according to a preferred embodiment of the present invention. An exposure apparatus 100 comprises an original stage RS which positions an original R, and a substrate stage WS which positions a substrate W. The exposure apparatus 100 further comprises an illumination optics IL which illuminates the original R to form an exposure beam containing pattern information on the original R, and a projection optics PL which projects the exposure beam containing the pattern information on the original R onto the substrate W coated with a photosensitive agent. Projection of the exposure beam onto the substrate W forms a latent pattern on the photosensitive agent on the substrate W. The substrate stage WS can employ the positioning apparatus exemplified by the above embodiments. The original stage RS can also employ a positioning apparatus comprising a hollow top plate exemplified by the above embodiments.

Figure 14:
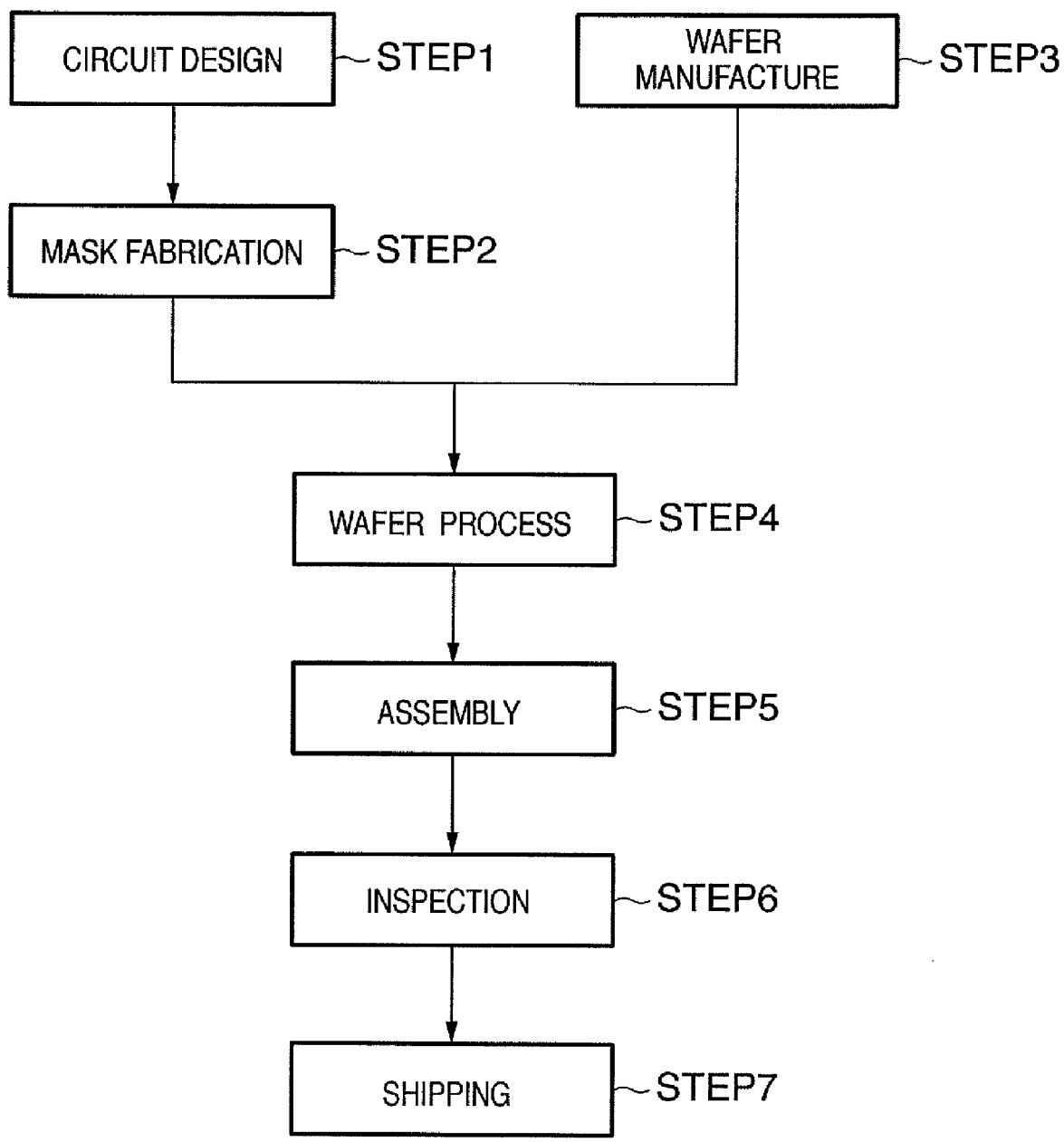
FIG. 14 is a flowchart to explain the manufacture of a device.

An embodiment of a device manufacturing method which utilizes the above exposure apparatus will be described with reference to FIGS. 14 and 15. FIG. 14 is a flowchart to describe the manufacturing of a device (a semiconductor chip such as an IC or LSI, an LCD, a CCD, or the like). A description will be made by taking as an example a method of manufacturing a semiconductor chip.

In step S1 (circuit design), the circuit of a semiconductor device is designed. In step S2 (mask fabrication), a mask is fabricated on the basis of the designed circuit pattern. In step S3 (wafer manufacture), a wafer is manufactured using a material such as silicon. In step S4 (wafer process) called a pre-process, the exposure apparatus described above forms an actual circuit on the wafer using the mask and wafer. In step S5 (assembly) called a post-process, a semiconductor chip is formed using the wafer fabricated in step S4. This step includes processes such as assembly (dicing and bonding) and packaging (chip encapsulation). In step S6 (inspection), inspections including an operation check test and durability test of the semiconductor device fabricated in step S5 are performed. A semiconductor device is finished with these steps and shipped (step S7).

Figure 15:
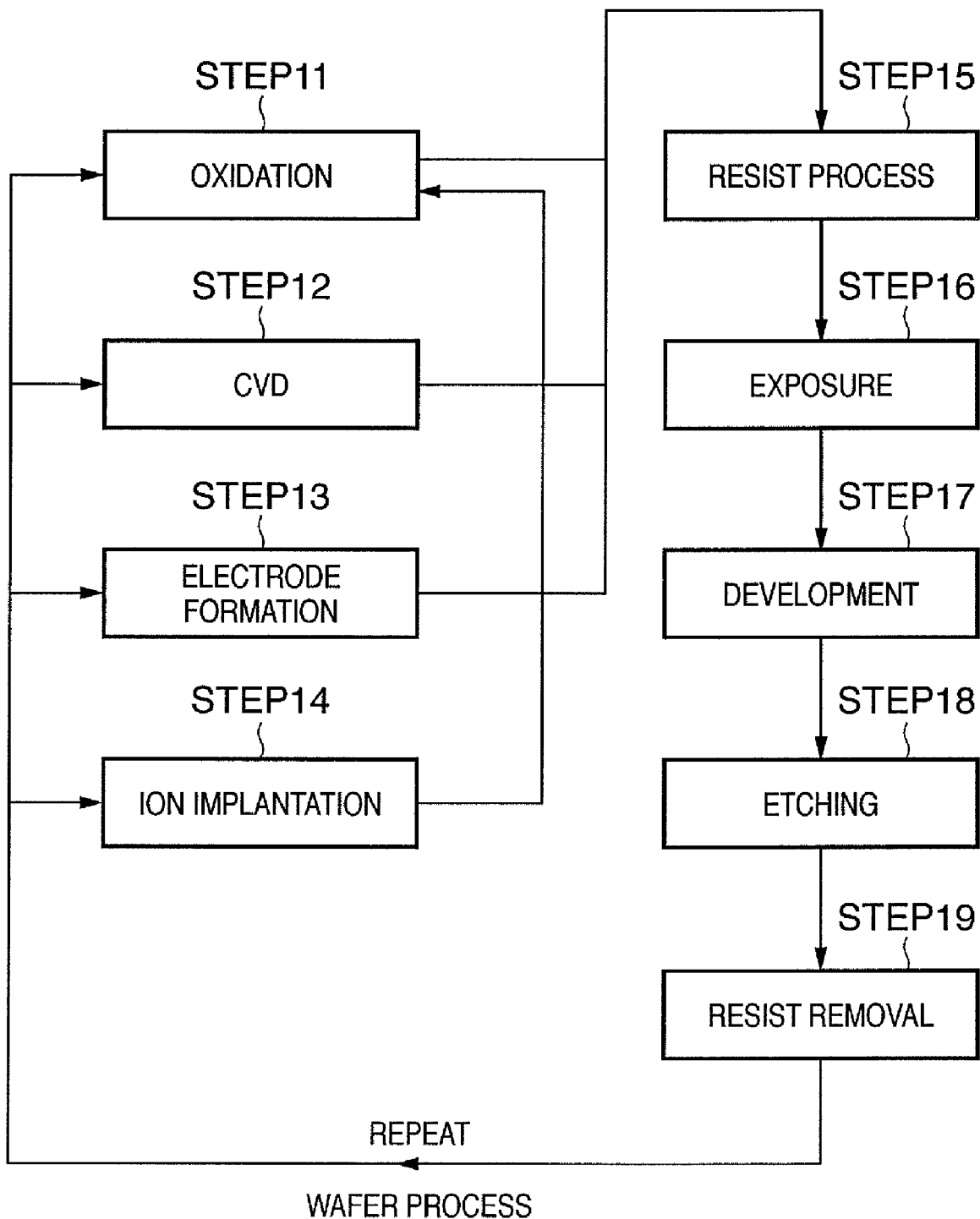
FIG. 15 is a detailed flowchart of the wafer process of step S4.

FIG. 15 is a detailed flowchart of the wafer process of step S4. In step S11 (oxidation), the surface of the wafer is oxidized. In step S12 (CVD), an insulating film is formed on the wafer surface. In step S13 (electrode formation), electrodes are formed. In step S14 (ion implantation), ions are implanted into the wafer. In step S15 (resist process), a photosensitive agent is applied to the wafer. In step S16 (exposure), the exposure apparatus projects the circuit pattern on the mask onto the photosensitive agent on the wafer to form a latent pattern on the photosensitive agent. In step S17 (development), the latent pattern formed on the photosensitive agent on the wafer is developed to form a patterned resist mask. In step S18 (etching), the resist is etched except the developed resist image. In step S19 (resist removal), an unnecessary resist after etching is removed. These steps are repeated to form multiple circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-018014 filed on Jan. 26, 2006, which is hereby incorporated by reference herein in its entirety.

What is claimed is:

1. A top plate including a first member and a second member, wherein
said first member and said second member include ribs, respectively,
at least either one of said rib of said first member and said rib of said second member includes a flange with an increased thickness to connect said rib of said first member to said rib of said second member, and
said second member is formed by connecting an opened hollow member having two open sides and a plate member.

2. The top plate according to claim 1, wherein said flange is formed on said rib of said first member.

3. A positioning apparatus comprising:
a top plate according to claim 1; and
a driving portion which drives said top plate.

4. An exposure apparatus comprising:
a positioning apparatus according to claim 3,
wherein said positioning apparatus positions either one of a substrate and an original.

5. A device manufacturing method comprising:
a step of forming a latent pattern on a photosensitive agent on a substrate by an exposure apparatus according to claim 4; and
a step of developing the photosensitive agent.

6. A top plate including a first member and a second member, wherein
said first member and said second member include ribs, respectively,
at least either one of said rib of said first member and said rib of said second member includes a flange with an increased thickness to connect said rib of said first member to said rib of said second member, and
the top plate incorporates a pin support mechanism.

* * * * *